(12) United States Patent
Calder

(10) Patent No.: US 9,380,726 B2
(45) Date of Patent: *Jun. 28, 2016

(54) RETAINER AND THERMAL DISPLACEMENT APPARATUS FOR ELECTRONIC COMPONENTS, METHODS OF PRODUCTION AND APPLICATIONS THEREOF

(71) Applicant: James Charles Calder, Huntington Beach, CA (US)

(72) Inventor: James Charles Calder, Huntington Beach, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/319,785

(22) Filed: Jun. 30, 2014

(65) Prior Publication Data

US 2015/0027664 A1    Jan. 29, 2015

Related U.S. Application Data

(63) Continuation-in-part of application No. 12/125,774, filed on May 22, 2008, now Pat. No. 8,764,338.

(60) Provisional application No. 60/939,423, filed on May 22, 2007.

(51) Int. Cl.
*H05K 7/14* (2006.01)

(52) U.S. Cl.
CPC ......... *H05K 7/1404* (2013.01); *Y10T 403/7067* (2015.01)

(58) Field of Classification Search
CPC ............ H05K 7/1409; H05K 7/20545; G01N 27/44756; G01N 27/44704
USPC ................ 403/409.1, 374.2–374.4; 165/80.2; 361/801
See application file for complete search history.

(56) References Cited

U.S. PATENT DOCUMENTS

| | | | | |
|---|---|---|---|---|
| 3,276,802 A * | 10/1966 | O'Brien | ................. | 52/690 |
| 3,375,030 A * | 3/1968 | Thompson | ................. | 403/231 |
| 3,920,345 A * | 11/1975 | Stoltz | ................. | 403/173 |
| 3,940,900 A * | 3/1976 | Russo | ................. | 52/656.1 |
| 4,036,371 A * | 7/1977 | Michel | ................. | 211/182 |
| 4,285,610 A * | 8/1981 | Rusch | ................. | 403/189 |
| 4,819,713 A | 4/1989 | Weisman | | |
| 4,824,303 A * | 4/1989 | Dinger | ................. | 411/79 |
| 5,090,840 A * | 2/1992 | Cosenza | ................. | 403/409.1 |
| 5,485,353 A * | 1/1996 | Hayes et al. | ................. | 361/802 |
| 6,239,972 B1 * | 5/2001 | Tehan et al. | ................. | 361/704 |
| 6,285,564 B1 * | 9/2001 | O'Brien | ................. | 361/801 |
| 6,835,021 B1 * | 12/2004 | McMillan | ................. | 403/374.4 |
| 7,031,167 B1 * | 4/2006 | Zagoory et al. | ................. | 361/759 |
| 2007/0253169 A1 * | 11/2007 | Clawser | ................. | 361/720 |

* cited by examiner

*Primary Examiner* — Joshua Kennedy
(74) *Attorney, Agent, or Firm* — Sandra P. Thompson; Slater Hersey & Lieberman, LLP

(57) ABSTRACT

Retainers are described that comprise at least one center body component comprising a plurality of center body troughs, and at least one compatible component comprising a plurality of compatible troughs, wherein at least part of the plurality of the compatible troughs couple with at least part of the plurality of center body troughs. In addition, thermal displacement devices are described that incorporate at least one retainers and at least one additional component, wherein the at least one retainer is coupled at least in part to the at least one additional component through a contact area or a substrate, surface or combination thereof, wherein the at least one retainer is coupled with the substrate, surface or combination thereof through a contact area.

18 Claims, 7 Drawing Sheets

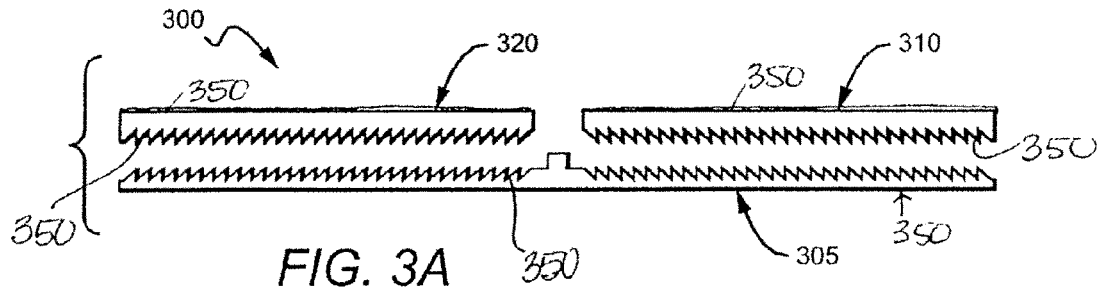
*FIG. 3A*
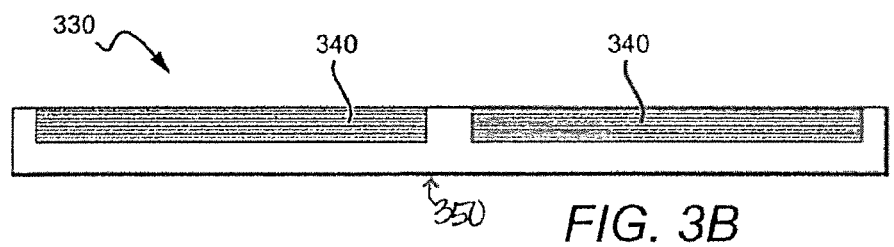
*FIG. 3B*
*FIG. 4*
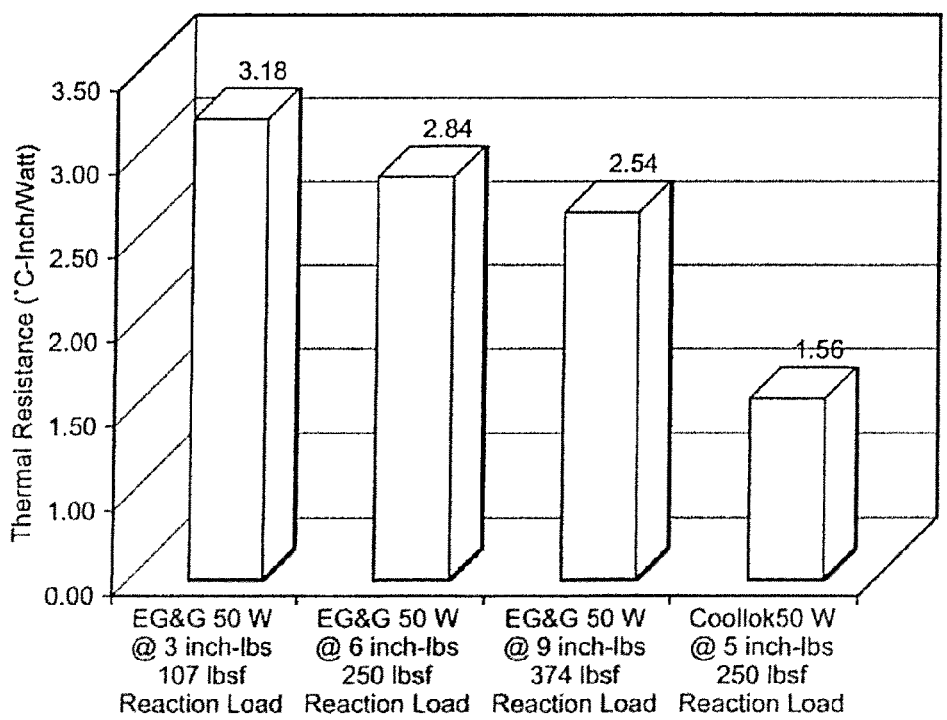

$\Delta T_1$ = JUNCTION--CASE
$\Delta T_2$ = CASE-SUBSTRATE
$\Delta T_3$ = SUBSTRATE
$\Delta T_4$ = SUBSTRATE--ADHESIVE
$\Delta T_5$ = MODULE FRAME
$\Delta T_6$ = MODULE FRAME--CARD RAIL
$\Delta T_7$ = CARD RAIL--COOLANT

FIG. 6

| RETAINER TYPE | THERMAL INTERFACE MATERIAL | THERMAL CONDUCTANCE (WATT/°C-INCH) | THERMAL RESISTANCE (°C/INCH-WATT) | THERMAL RESISTANCE (°C/WATT-INCH) | THERMAL RESISTANCE (°C/WATT) | AVERAGE HEATER TEMP (°C) |
|---|---|---|---|---|---|---|
| Wedgelock | No Thermal Interface Material | 1.56 | 0.643 | 0.029 | 0.136 | 132.6 |
| Gear Style (Coollok) | No Thermal Interface Material | 2.43 | 0.113 | 0.018 | 0.087 | 131.4 |
| Gear Style (Coollok) | Locktite Powerstrate Extreme | 3.00 | 0.334 | 0.015 | 0.070 | 130.3 |
| Gear Style (Coollok) | A1 Technologies CR7058 | 2.81 | 0.355 | 0.016 | 0.075 | 131.3 |

STANDARD CONFIGURATION

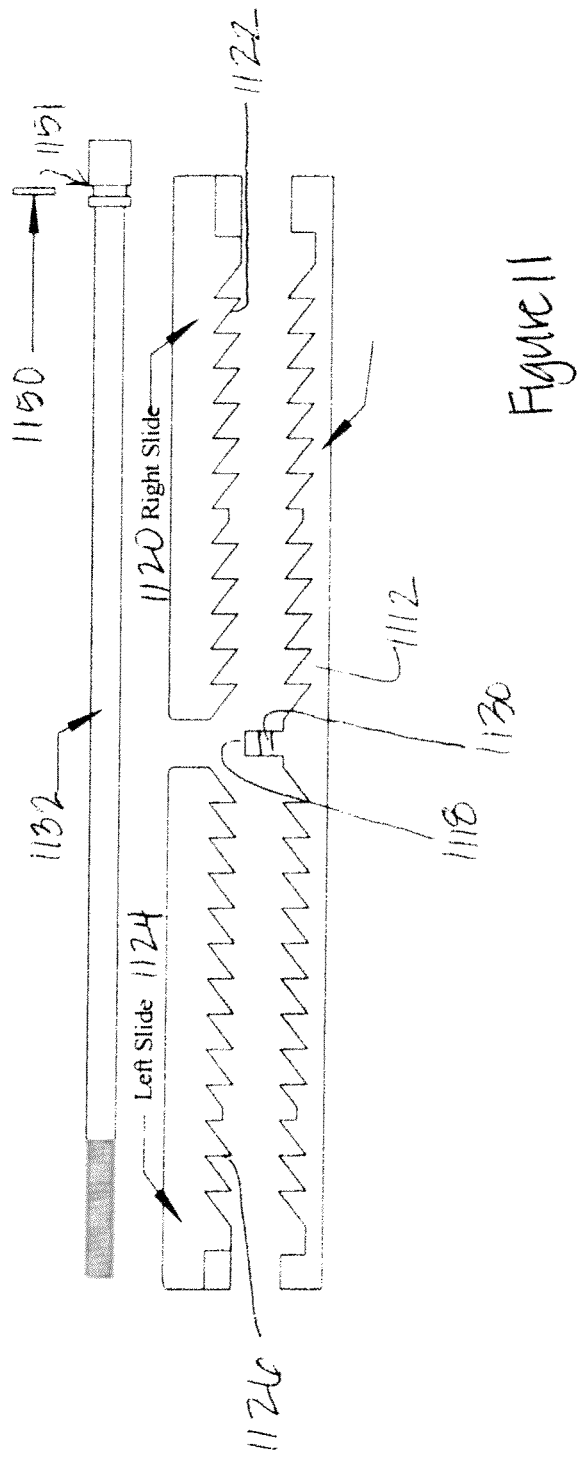

RETAINER AND THERMAL DISPLACEMENT APPARATUS FOR ELECTRONIC COMPONENTS, METHODS OF PRODUCTION AND APPLICATIONS THEREOF

This application is a United States Continuation in Part Application that claims priority to U.S. Utility application Ser. No. 12/125,774 filed on May 22, 2008, now U.S. Pat. No. 8,764,338 and entitled: "Retainer and Thermal Displacement Apparatus for Electronic Components, Methods of Production and Applications Thereof", which is based on U.S. Provisional Application Ser. No.: 60/939,423 filed on May 22, 2007, all of which are commonly-owned and incorporated herein in their entirety.

FIELD OF THE SUBJECT MATTER

The field of the subject matter is a retainer or an integrated, combination component for attachment of electronic components in an enclosure. Specifically, a retainer or retainer/module frame for attaching electronic components in a component storage and operation enclosure or cabinet is described, where the retainer and/or retainer/module frame provide efficient heat exchange between the electronic components, electronic modules and a heat spreader/dispersant, heat exchanger or heat sink device.

BACKGROUND OF THE SUBJECT MATTER

Conventional apparatus utilized to cool electronic components while in use in aerospace, aviation, laser apparatus and military applications are often unsatisfactory. Conventional apparatus fail to provide an adequate conductive heat path and convective heat transfer systems for the cooling of electronic components.

As machinery in these industries continues to evolve by becoming smaller, having increased power requirements and/or more complicated, the need has developed for additional electronics and higher capacity processing of electronic components. Higher capacity processing and additional electronics associated with more sophisticated machinery has led to increased thermal waste in the form of heat. In addition, current electronics and higher capacity processors have been sized down to fit into smaller equipment with limited space for cooling. Advancements in these industries drive the search for more efficient ways to dissipate heat and maintain the electronics at optimal temperatures.

In order to facilitate the discovery of novel apparatus and methods for improved cooling and thermal dispersement, it is important to understand the "science" behind the process of cooling in these applications. Adequate heat exchange of electronic components depends on the steady, low resistance contact between the component(s) generating the heat or thermal energy and the surrounding components, modules or space. In the industries mentioned earlier, some of the more critical cooling challenges are found when investigating the thermal path between electronic components, generally found on a module frame, and a heat spreader or heat sinking device that is coupled to or near the electronic component. In this example, the pathway for heat exchange includes attachment or coupling of the module frame to a card rail. A liquid or air cooled heat spreader or heat sinking device is also attached or integrated into the pathway. The module frame may be directly attached to a card rail by an integrated retainer, or coupled to the card rail by a retainer that couples the module frame to the card rail through the application of variable force.

As shown in U.S. Pat. No. 4,819,713, a conventional retainer 100 (Prior Art FIG. 1A) referred to as a "Card-LOK" retainer is disclosed. This "stand alone retainer" provides heat exchange using a device having a screw (not shown) that passes through the entire retainer, which comprises a front wedge segment 110, a center body segment 120 and a rear wedge segment 130—all of which have a threaded hole (not shown). The wedge segments have a trapezoidal configuration with angled ends that allows them to move in relation to one another. The retainer is then coupled to the module frame. The screw is designed to move and reposition the wedge segments with respect to one another to produce, in some instances, a staggered configuration. The screw is also designed to lock the module frame in place through the expansion of the retainer up against the module frame. This contact provides a contact between the module frame and the card rail incorporating the heat sinking device. Heat or thermal energy generally travels a path from the module frame to the one adjacent coldwall and not through the retainer and to the heat sinking device. This path isn't adequate, since heat and thermal energy will be released into the overall system, which can potentially create overheating of other components and ultimately a shut down of the entire system.

One problem with the heat transfer system or wedge system described above is that heat must move through the shear regions of the retainer segments (blocks). These types of retainers tend to use open cavity extrusions that rely on tangential contact to create the wedge-segment displacement. Heat transfer must also traverse these interfaces for conductive heat sinking. Laboratory evaluation has shown that the contact between shear planes (segments) occurs as 'point' contact or near point contact, since the wedges do not displace sufficiently in the normal direction relative to the heat conducting surfaces. Another result of this non-uniform wedge displacement is that thermal contact to the heat sinking device tends to occur as a point contact or near point contact (see reference number 230) (see Prior Art FIG. 1B). Prior Art FIG. 1B shows a contact map 210 between a conventional wedge retainer (not shown) and a cold wall interface 220 at 325 pounds reaction force. Given that the contact surface area is a key component of any good thermal displacement system, these conventional retainers do not perform to the standards that are currently needed.

Another consideration is that the aerospace industry cannot rely upon convective heat transfer as an efficient method for dissipating heat, primarily because of the vacuum atmosphere in space or high altitude for aircraft. Accordingly, aerospace components generally rely upon conductive heat transfer during use to dissipate heat. Conventional retainers that effectively create point or near point contacts will significantly limit heat transfer, and therefore, it is likely that electronic components and other sensitive parts near the thermal source will be damaged or destroyed.

Therefore, there is a need in the aerospace, aviation and other related industries to produce a retainer, and ultimately a retainer/module system, that addresses at least one of the following goals: a) provides a continuous conductor path through the retainer, b) provides an increased and near complete contact surface area between the retainer and the component to which it is coupled or attached, c) can fit easily within conventional systems without any need for a redesign of the other components, d) can be manufactured utilizing any suitable thermal transfer material or constituent, e) provides a complete contact surface area between the retainer and the component to which it is coupled or attached in a range of temperatures, including cold, cool, warm, hot or very hot, and f) can improve both the convective and conductive transfer of heat over conventional retainers and heat transfer devices.

SUMMARY OF THE SUBJECT MATTER

Retainers are described that comprise at least one center body component comprising a plurality of center body troughs, and at least one compatible component comprising a plurality of compatible troughs, wherein at least part of the plurality of the compatible troughs couple with at least part of the plurality of center body troughs, wherein at least one of the components is at least coated in part with at least one layer of a coating material.

Retainers disclosed herein comprise: a center body component comprising a plurality of center body troughs, a raised nodule located on the center body component, wherein the nodule has a channel running through it in a horizontal direction relative to the center body component, two independent compatible components, wherein each independent component comprises a plurality of compatible permanently connected troughs, wherein the troughs of the at least one compatible component couple with at least part of the plurality of center body troughs, and wherein each independent component comprises a channel running through it in a horizontal direction; and a support screw that is inserted into one independent compatible component, through the raised nodule and into the second independent compatible component, wherein the support screw locks the center body component together with the two independent compatible components and wherein at least one of the components is at least coated in part with at least one layer of a coating material.

In addition, thermal displacement devices are described that incorporate at least one retainer, at least one securing component, and at least one additional component, wherein the at least one retainer is coupled at least in part to the at least one additional component through a contact area or a substrate, surface or combination thereof, wherein the at least one retainer is coupled with the substrate, surface or combination thereof through a contact area.

BRIEF DESCRIPTION OF THE FIGURES

Prior Art

FIGS. 3A and 3B shows the increased contact area and constant distribution of heat throughout the body of the proposed retainer.

FIG. 4 shows representative thermal data.

FIG. 6 comprises representative data for the current state of the art of these components.

FIG. 11 shows a contemplated retainer where the at least one securing component is also shown. In this embodiment, the at least one securing component comprises at least one pin.

DESCRIPTION OF THE SUBJECT MATTER

Surprisingly, a retainer/module system has been developed for use in the aerospace, aviation and other related industries that addresses at least one of the following goals: a) provides a continuous conductor path through the retainer, b) provides an increased and near complete contact surface area between the retainer and the component to which it is coupled or attached, c) can fit easily within conventional systems without any need for a redesign of the other components, d) can be manufactured utilizing any suitable thermal transfer material or constituent, e) provides a complete contact surface area between the retainer and the component to which it is coupled or attached in a range of temperatures, including cold, cool, warm, hot or very hot, and f) can improve both the convective and conductive transfer of heat over conventional retainers and heat transfer devices.

Specifically, contemplated retainers and related apparatus are disclosed herein that meet at least one of the above-stated goals alone or in combination with modules, module frames or entire module/module frame/card rail assemblies (referred to herein as "integrated assemblies"). Retainers are described that comprise at least one center body component comprising a plurality of center body troughs, and at least one compatible component comprising a plurality of compatible troughs, wherein at least part of the plurality of the compatible troughs couple with at least part of the plurality of center body troughs. In addition, thermal displacement devices are described that incorporate at least one retainers and at least one additional component, wherein the at least one retainer is coupled at least in part to the at least one additional component through a contact area.

Operational and thermal benefits, including increased capacity for conductive and convective heat transfer, are observed through increasing the surface contact area and increased cross-sectional area of heat flow between the module frame, the retainer, and the heat sink. Contemplated retainers also provide stability for the integrated assembly throughout all thermal conditions, because it expands and contracts easily despite changes in the thermal transfer load and other surrounding environment conditions.

Figure 2:
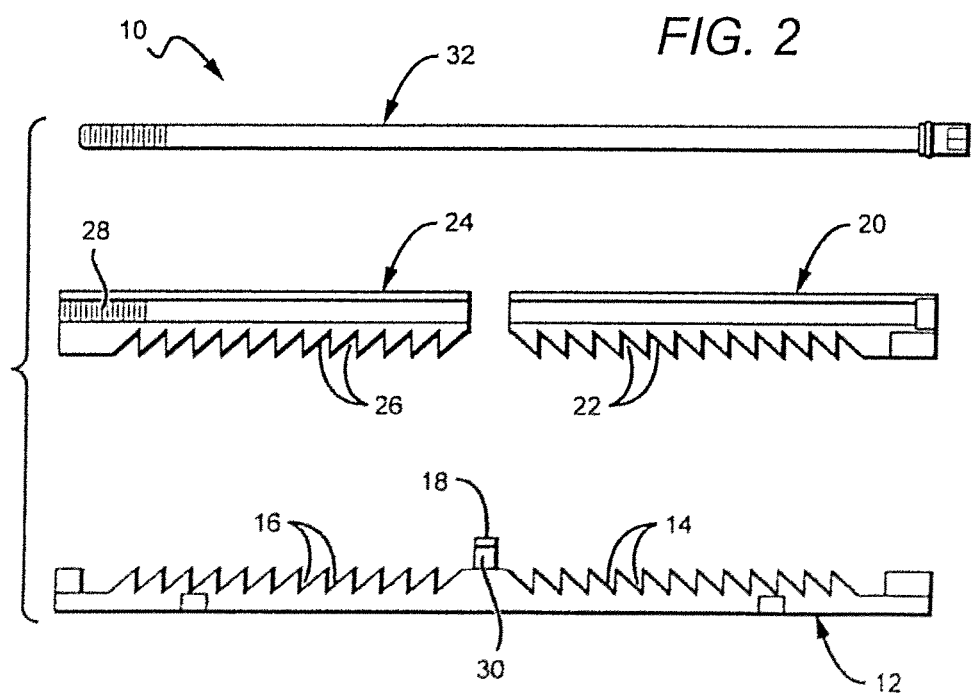
FIG. 2 shows a contemplated retainer 10 comprising a center body component 12 with a plurality of troughs (14 and 16) designed to accept—in a male/female fashion—a series of complementary troughs designed in another independent and compatible component.

FIG. 2 shows a contemplated retainer 10 comprising a center body component 12 with a plurality of troughs (14 and 16) designed to accept—in a male/female fashion—a series of complementary troughs designed in another independent component. For example, in FIG. 2, the plurality of troughs are shown as separate and opposing arrangements (14 and 16) on the center body 12. In another embodiment, the plurality of troughs may not be opposing one another, but in fact may all be facing one direction. This design choice would depend, in some instances, on the integrated assembly need and overall design. Two independent components (20 and 24), each having a plurality of troughs (22 and 26, respectively) designed to complement the troughs found on the center body 12, are utilized in conjunction with the center body 12 in this particular embodiment. On the center body 12 is a raised portion or nodule 18 with a channel 30 running through it in a horizontal direction relative to the center body 12. A corresponding channel runs through both independent components 20 and 24. Thus, when the center body 12 is coupled with the two independent components 20 and 24, a support screw 32 can be inserted in the channel of one of the independent components 20 and 24 and run the length of the retainer through the channel. Support screw 32 is designed to compress independent compatible components 20 and 24 by pushing each of them closer to raised portion or raised nodule 18, which ultimately locks the components of the retainer in place with the module/module frame and forms a completed integrated assembly.

The apparatus accomplishes this effective heat transfer technique by the use of complementing gear-style contact and load schemes. One embodiment of the retainer comprises three component bodies interlocked by a screw, which is shown in FIG. 2. Other embodiments comprise more or less component bodies interlocked by one or more screws or other fastening devices, or as discussed above, an integrated assembly. For example, FIG. 11 shows the addition of securing components 1150, in this embodiment—pins, that allow the retainer to be secured together through hole or holes 1151. Two independent components (1120 and 1124), each having a plurality of troughs (1122 and 1126, respectively) designed to complement the troughs found on the center body 1112, are utilized in conjunction with the center body 1112 in this particular embodiment. On the center body 1112 is a raised portion or nodule 1118 with a channel 1130 running through it in a horizontal direction relative to the center body 1112. A corresponding channel runs through both independent components 1120 and 1124. Thus, when the center body 1112 is coupled with the two independent components 1120 and 1124, a support screw 1132 can be inserted in the channel of one of the independent components 1120 and 1124 and run the length of the retainer through the channel. Support screw 1132 is designed to compress independent compatible components 1120 and 1124 by pushing each of them closer to raised portion or raised nodule 1118, which ultimately locks the components of the retainer in place with the module/module frame and forms a completed integrated assembly.

Unlike the conventional apparatus used in the industry, embodiments such as the one shown in FIG. 2 provide additional contact surface allowing for a significance increase in the conduction path cross-sectional area and with that increased contact surface comes dissipation of heat and reduction of resistance. This reduction of resistance directly translates to an increase in conduction, convection, extended life, and reduced operational life cycle cost.

The increase contact surface also leads to improved clamping performance as the added rigidity results in less vibrational damage, such improvement is beneficial in extending the longevity of delicate electronic components and allows for closer proximity of multiple card rails and integrated assemblies packed into an enclosure, leading to more compact, efficient enclosure.

Figure 1A:
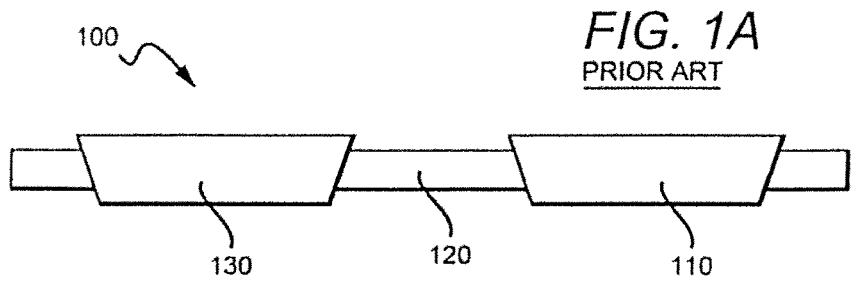
FIGS. 1A and 1B shows that the result of a non-uniform wedge displacement is that thermal contact to the heat sinking device tends to occur as a point contact or near point contact.
Figure 1B:
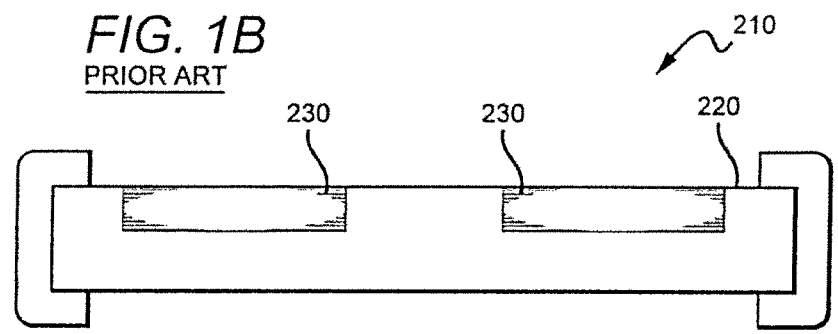

FIG. 3A shows a contemplated retainer 300 and FIG. 3B shows a contact map 330 similar to the one shown in FIG. 1B, which shows the increased contact area 340 and constant distribution of heat throughout the body of the proposed retainer (not shown in FIG. 3B). As a comparison, Prior Art FIG. 1B shows the contact area and distribution of heat in a conventional wedge style retainer, such as the one discussed above from U.S. Pat. No. 4,819,713. The dark areas indicate contact pressure points 340. As can be seen in FIG. 3B, the concentration of force exerted upon the proposed retainer is displaced throughout the entire body of the retainer creating a uniform contact patch, whereas in Prior Art FIG. 1B points of force are created that result in a less efficient contact patch. In FIG. 3A, the center body 305 is shown, along with independent components 310 and 320. The support screw is not shown. FIGS. 3A and 3B also show a contemplated coating material 350, which may be coated over all of the components or may be coated over some of the components depending on the needs of the retainer in its intended use or placement. Contemplated coating material 350 may also comprise coating material layers.

Specifically, a contemplated thermal displacement apparatus comprises at least one of the retainers disclosed herein and a substrate, surface or combination thereof, wherein the retainer is coupled with the substrate, surface or combination thereof through a contact area. In these embodiments, the contact area is increased at least 10% over a conventional thermal displacement apparatus comprising a wedge style retainer and a surface. In another embodiment, the contact area is increased at least 25% over a conventional thermal displacement apparatus comprising a wedge style retainer and a surface. In yet another embodiment, the contact area is increased at least 50% over a conventional thermal displacement apparatus comprising a wedge style retainer and a surface. In other embodiments, the contact area is increased at least 75% over a conventional thermal displacement apparatus comprising a wedge style retainer and a surface. In yet other embodiments, the contact area is increased at least 100% over a conventional thermal displacement apparatus comprising a wedge style retainer and a surface.

Additionally, a contemplated thermal displacement device comprises at least one of the retainers disclosed herein and at least one additional component, wherein the retainer is coupled with the at least one additional component through a contact area. In these embodiments, the contact area is increased at least 10% over a conventional thermal displacement device comprising a wedge style retainer and an additional component. In another embodiment, the contact area is increased at least 25% over a conventional thermal displacement device comprising a wedge style retainer and an additional component. In yet another embodiment, the contact area is increased at least 50% over a conventional thermal displacement device comprising a wedge style retainer and an additional component. In other embodiments, the contact area is increased at least 75% over a conventional thermal displacement device comprising a wedge style retainer and an additional component. In yet other embodiments, the contact area is increased at least 100% over a conventional thermal displacement device comprising a wedge style retainer and an additional component.

Figure 5:
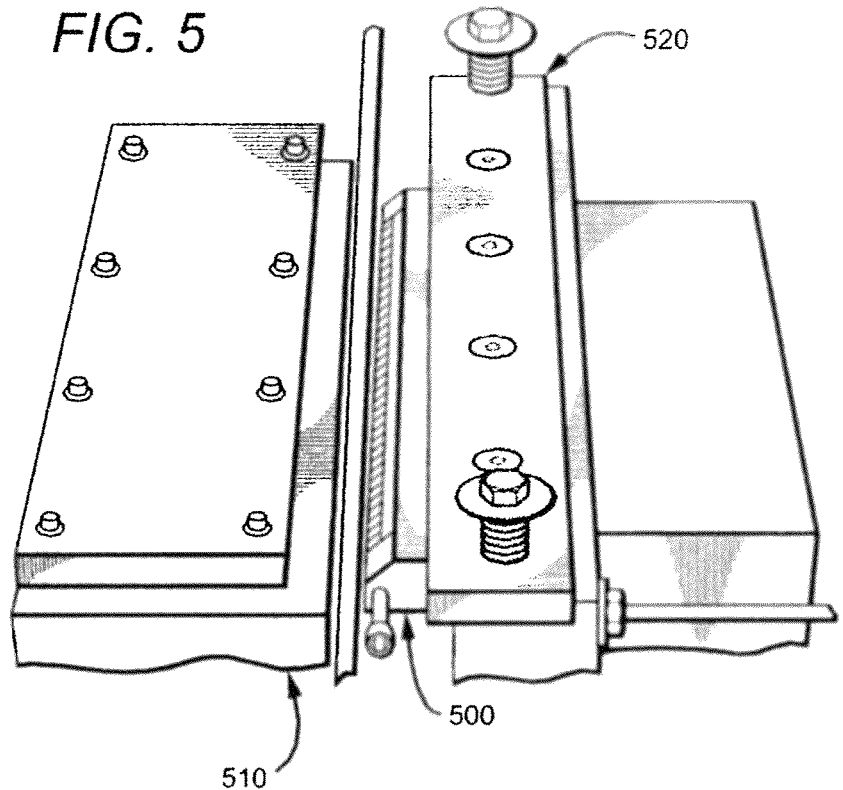
FIG. 5 shows a contemplated configuration.

Initial laboratory evaluations on the proposed retainer, performed with the avionics rack thermal simulator, in comparison to the conventional wedge-type retainer has shown significant increase in thermal performance over the conventional retainers. A decrease of thermal resistance by nearly a factor of two has been shown relative to a standard 5-segment wedge retainer system. The accepted range of performance for a conventional retainer is commonly reported to fall within the range of 2° to 4° C. inch/watt for a high performance wedge retainer. Initial data generated on the proposed retainer indicates a value well below 1.6° C. inch/watt (See FIG. 4 and FIG. 5, which is the mechanical arrangement used for FIG. 4 data). In FIG. 5, the retainer 500 is shown in place between two components 510 and 520. This reduction of thermal resistance will correlate to an increase in thermal conduction, extended life, and reduced operational life cycle costs of high-powered modules. FIG. 6, as is described, comprises representative data for the current state of the art of these components.

In addition, application of contemplated retainers at high altitudes or in the vacuum of space should result in performance gains relative to wedge style systems. Current wedge retainer designs benefit in part from convective heat transfer. However, it is conductive heat transfer in space applications that drives system performance. The retainer design proposed promotes and optimizes conductive heat transfer.

The fundamental design methodology takes advantage of a gear style contact and load scheme that will provide uniform clamping forces and exceptional heat transfer. The general configuration is shown in FIGS. 2, 3 and 5. This demonstrated system has exhibited tremendous potential in initial and more current thermal testing (See FIGS. 4 and 6). Thermal results from these components shown in Prior Art FIG. 1B and FIG. 3B were used to develop the thermal data as shown in FIG. 4.

Figure 7:
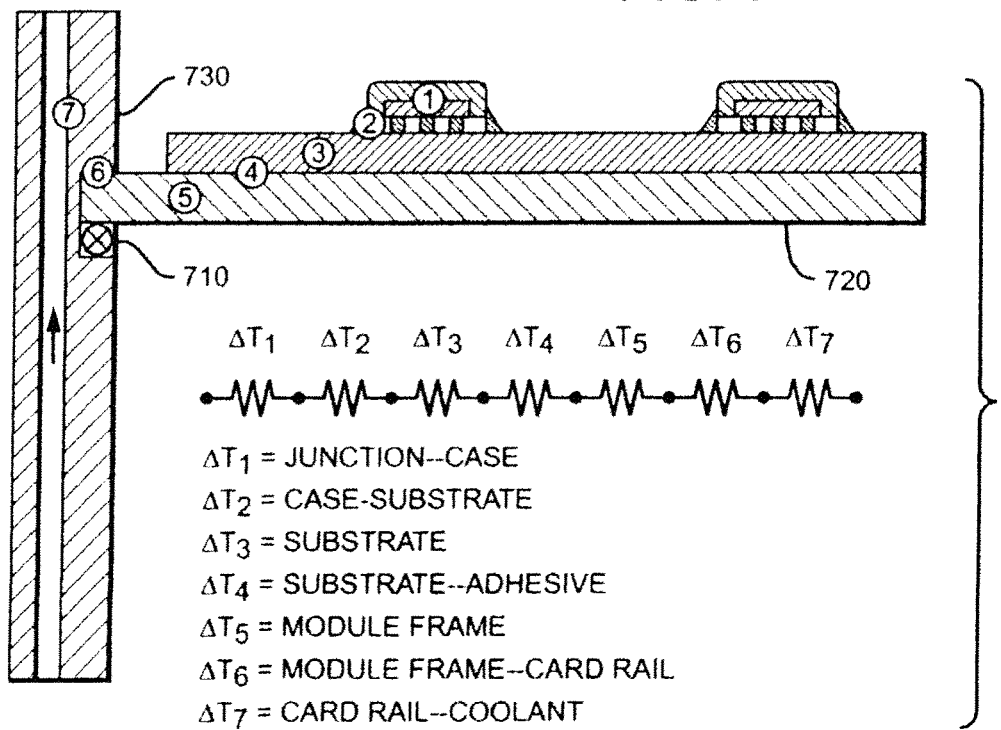
FIG. 7 illustrates the thermal path and its restrictions in terms of heat transfer for providing module frame cooling.

In terms of system performance, FIG. 7 illustrates the thermal path and its restrictions in terms of heat transfer for providing module frame cooling. Cooling is impeded by the series of thermal resistors (numbered). The primary opportunity provided within the series is to create an additional thermal path in parallel to the thermal interface 6. This path is through the retainer 710 where the lock mechanism or support screw of the retainer 710 is shown. Current wedge retainers contribute to less than 15% of the thermal conduction path. Essentially all heat transfer occurs between the module frame 720 and sink device 730 (side opposite to retainer). Space based systems rely entirely on this heat path, as convection is non-existent in the retainer. By increasing the thermal conduction efficiency of the retainer, heat transfer between the module frame and sink device is optimized leading to maximum thermal performance. Secondary opportunities include increased heat transfer at interface 6 from improved clamping performance between the module frame and sink device. Other benefits of the clamping are increased structural rigidity. Added structural rigidity will result in less deflection from vibration which is beneficial in systems where the "pitch" distance from card guide to card guide is extremely short.

Figure 8:
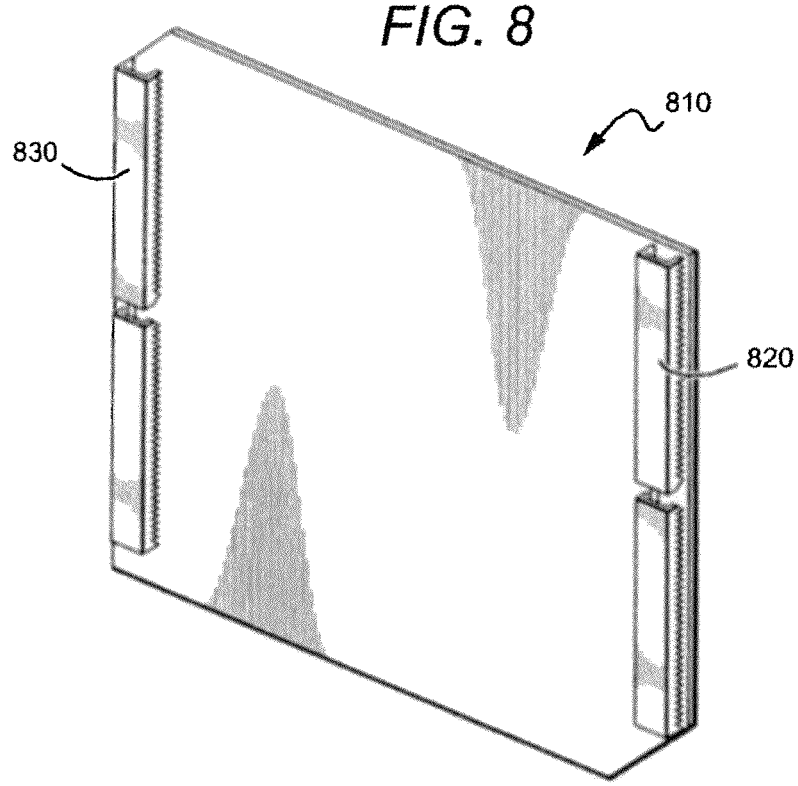
FIG. 8 shows a module 810 comprising two retainers 820 and 830. In this Figure, the retainers are fully assembled and locked in place.
Figure 9:
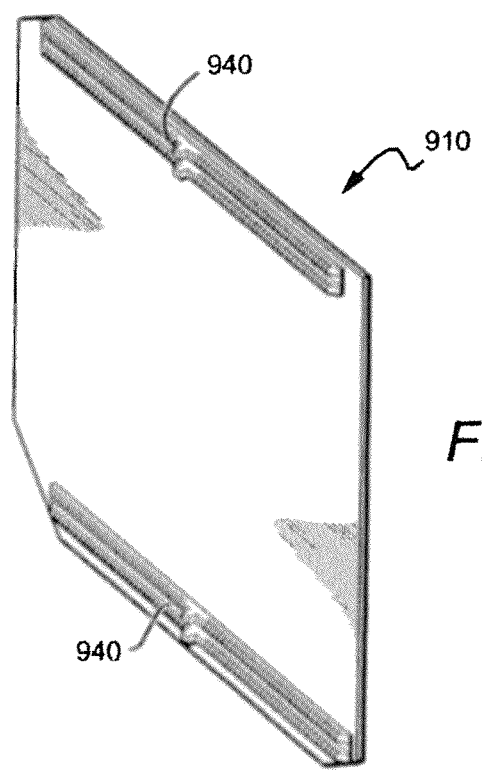
FIG. 9 shows the same module 910 where only the center body portion of the retainer 940 is shown.
Figure 10:
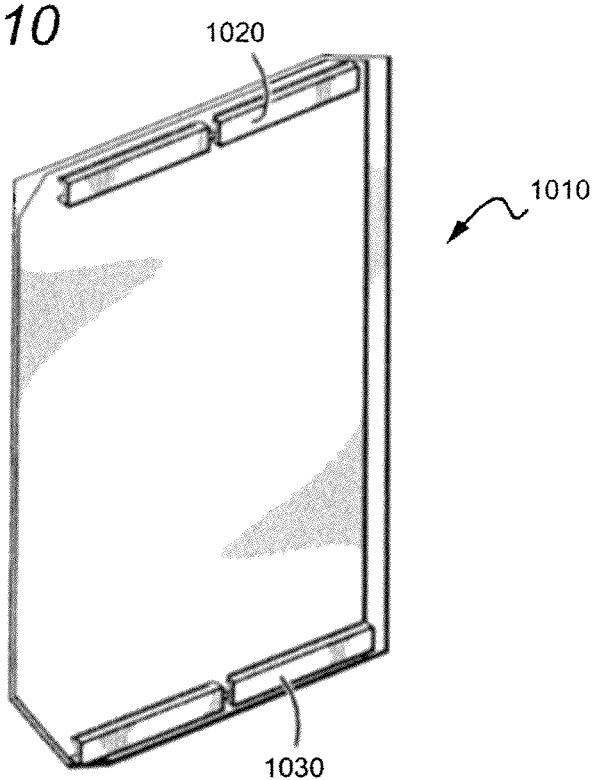
FIG. 10 shows another module 1010 comprising two retainers 1020 and 1030. In this Figure, the retainers are fully assembled and locked in place.

Retainers, card rails, modules and module frames may be fashioned or produced as separate components or may be molded and/or produced as "combination components". As used herein, the phrase "combination components" means that the component is a "one-piece" unit that is a combination of what can also be produced as multiple pieces. For example, the retainer, in whole or in part, and module may be molded or machined as one part, instead of two separate stand-alone parts. It should be understood that the functionality of these components will not change based on the fact that they are fashioned or machined as one part instead of multiple parts. A contemplated combination component is shown in FIGS. 8-10, where at least one retainer is coupled with a card rail. FIG. 8 shows a module 810 comprising two retainers 820 and 830. In this Figure, the retainers are fully assembled and locked in place. FIG. 9 shows the same module 910 where only the center body portion of the retainer 940 is shown. FIG. 10 shows another module 1010 comprising two retainers 1020 and 1030. In this Figure, the retainers are fully assembled and locked in place.

Retainers, card rails, modules and module frames may comprise any suitable material or constituent, as long as the component can withstand the use and temperature ranges that are typical in these types of applications. Contemplated materials include metals, metal alloys, composites, polymer composites, ceramics, ceramic composites, doped and mixed materials. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, lead, gallium and alloys thereof, silver coated copper, and silver coated aluminum. The term "metal" also includes alloys, metal/metal composites, metal ceramic composites, metal polymer composites, as well as other metal composites. As used herein, the term "compound" means a substance with constant composition that can be broken down into elements by chemical processes. As used herein, the phrase "metal-based" refers to any coating, film, composition or compound that comprises at least one metal.

It should be emphasized at this point that additional technical objectives will further enhance and improve upon the embodiments disclosed. Such objectives include: gear angle optimization for maximum clamping and ease of module removal from the card cage; optimization of manufacturing approach, as current methods of EDM machining will need to be refined in terms of cycle time and new manufacturing methods will be investigated. The displacement mechanism will be developed and implemented, as current design intent is to use high aspect ratio screw fasteners as used in the wedge retainers to create the effective motion for retainer displacing and clamping; clutch type and novel torque limiting methods will be incorporated for retainer actuation. Advanced coating schemes, coating materials and layers of coating materials, as well as conventional approaches such as anodization may be incorporated.

In some embodiments, increased thermal performance coupled with low coefficient of friction would increase efficiency and longevity, and one contemplated process is PVD coating or utilizing a suitable coating material or layers of coating materials. Some contemplated coating materials include chromate conversion coatings, release coatings, lubricants and other suitable coatings. In some of these contemplated embodiments, one or more components may go through a surface preparation process, such as being bead blasted, sanded or otherwise physically treated in order to roughen or smooth the surfaces, depending on the needs of the components and the types of coatings.

Another contemplated embodiment that is specific to retainers is the use of titanium nitride (TiN), which may be evaluated for its low coefficient of friction and high hardness characteristics. Desirable parameters to review include interface contact percentage, friction, manufacturing approach, and ease of backplane (card) removal (provides added practical efficiencies). The use of high conductivity graphite and conductive metallics, as well as composites and graphite composites for material optimization, will improve conductive and convective utility.

It is instructive to note that while some contemplated embodiments utilize chromate conversion coatings and release agents, other suitable coatings and layered coatings may be used, as disclosed herein, based on the design and needs of the retainer or thermal displacement device.

Thus, specific embodiments and applications of retainers and thermal displacement apparatus or devices for electronic components, their methods of production and applications or uses thereof have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

I claim:

1. A retainer, comprising:
    at least one center body component comprising a plurality of wedge-shaped center body troughs,
    a single, raised nodule located on the center body component, wherein the nodule has a channel running through it in a horizontal direction relative to the at least one center body component,
    at least two independent compatible components comprising a plurality of compatible troughs, wherein at least part of the plurality of the compatible troughs couple with at least part of the plurality of center body troughs wherein at least one of the components is at least coated in part with at least one layer of a coating material, and wherein each compatible component comprises a channel running through it in a horizontal direction; and
    a support screw that is inserted into one independent compatible component, through the raised nodule and into the second independent compatible component, wherein the support screw locks the center body component together with the independent compatible components.

2. The retainer of claim 1, wherein the retainer comprises a material suitable for thermal displacement.

3. The retainer of claim 2, wherein the material comprises a metal, metal alloy, composite material, polymer composite material, ceramic material, ceramic composite material, doped and mixed materials or combination thereof.

4. The retainer of claim 1, wherein the coating material comprises a material suitable for thermal displacement.

5. The retainer of claim 4, wherein the coating material comprises a metal, metal alloy, composite material, polymer composite material, ceramic material, ceramic composite material, doped and mixed materials or combination thereof.

6. The retainer of claim 1, wherein the thermal resistance of the retainer is less than 2° C. inch/Watt.

7. The retainer of claim 1, wherein the thermal resistance of the retainer is less than 1.6° C. inch/Watt.

8. A thermal displacement apparatus, comprising:
    at least one of the retainers of claim 1, and
    a substrate, surface or combination thereof, wherein the at least one retainer is coupled with the substrate, surface or combination thereof through a contact area.

9. A thermal displacement device, comprising:
    at least one of the retainers of claim 1,
    at least one securing component; and
    at least one additional component, wherein the at least one retainer is coupled at least in part to the at least one additional component through a contact area.

10. The thermal displacement device of claim 9, wherein the at least one additional component comprises a thermal interface material, a card rail, a module, a module frame or a combination thereof.

11. The thermal displacement device of claim 9, wherein the at least one securing component comprises at least one pin.

12. The thermal displacement device of claim 11, wherein the at least one pin is designed to be secured into each end of the at least one retainer.

13. The thermal displacement device of claim 9, wherein the contact area is increased at least 10% over a thermal displacement device comprising only a wedge style retainer and an additional component.

14. A retainer, comprising:
    a center body component comprising a plurality of wedge-shaped center body troughs,
    a raised nodule located on the center body component, wherein the nodule has a channel running through it in a horizontal direction relative to the center body component,
    two independent compatible components, wherein each independent component comprises a plurality of compatible permanently connected troughs, wherein the troughs of the two compatible components couple with at least part of the plurality of center body troughs, and wherein each independent component comprises a channel running through it in a horizontal direction;
    and a support screw that is inserted into the channel of one independent compatible component, through the channel of the raised nodule and into the channel of the second independent compatible component, wherein the support screw locks the center body component together with the two independent compatible components in a complementary fashion and wherein at least one of the components is at least coated in part with at least one layer of a coating material.

15. The retainer of claim 14, wherein the retainer comprises a material suitable for thermal displacement.

16. The retainer of claim 15, wherein the material comprises a metal, metal alloy, composite material, polymer composite material, ceramic material, ceramic composite material, doped and mixed materials or combination thereof.

17. The retainer of claim 14, wherein the coating material comprises a material suitable for thermal displacement.

18. The retainer of claim 17, wherein the coating material comprises a metal, metal alloy, composite material, polymer composite material, ceramic material, ceramic composite material, doped and mixed materials or combination thereof.

* * * * *